United States Patent
Longeville et al.

(10) Patent No.: US 9,627,870 B2
(45) Date of Patent: Apr. 18, 2017

(54) ELECTRICAL HOUSING FOR ELECTRICAL EQUIPMENT

(71) Applicants: LEGRAND FRANCE, Limoges (FR); LEGRAND SNC, Limoges (FR)

(72) Inventors: Jerome Longeville, Panazol (FR); Gokularajah Ganesaratnam, Romorantin-Lanthenay (FR)

(73) Assignees: LEGRAND FRANCE, Limoges (FR); LEGRAND SNC, Limoges (FR)

( * ) Notice: Subject to any disclaimer, the term of this patent is extended or adjusted under 35 U.S.C. 154(b) by 0 days.

(21) Appl. No.: 14/653,764

(22) PCT Filed: Dec. 17, 2013

(86) PCT No.: PCT/FR2013/053123
§ 371 (c)(1),
(2) Date: Jun. 18, 2015

(87) PCT Pub. No.: WO2014/096674
PCT Pub. Date: Jun. 26, 2014

(65) Prior Publication Data
US 2015/0325992 A1    Nov. 12, 2015

(30) Foreign Application Priority Data

Dec. 20, 2012    (FR) ...................................... 12 03512

(51) Int. Cl.
| | |
|---|---|
| *H05K 5/03* | (2006.01) |
| *H02G 3/08* | (2006.01) |
| *H05K 5/02* | (2006.01) |
| *H02G 3/12* | (2006.01) |
| *H02G 15/02* | (2006.01) |
| *H02G 3/18* | (2006.01) |

(Continued)

(52) U.S. Cl.
CPC ............... *H02G 3/083* (2013.01); *H02G 3/12* (2013.01); *H02G 3/18* (2013.01); *H02G 15/02* (2013.01);
(Continued)

(58) Field of Classification Search
CPC ................................................. H05K 5/0247
(Continued)

(56) References Cited

U.S. PATENT DOCUMENTS 4,180,303 A * 12/1979 Damsky ................. H01R 31/00
439/365
4,669,804 A    6/1987 Munroe
(Continued)

FOREIGN PATENT DOCUMENTS

DE    44 36 147 A1    4/1996

OTHER PUBLICATIONS

International Search Report, dated Mar. 7, 2014, from corresponding PCT application.

*Primary Examiner* — Hung V Ngo
(74) *Attorney, Agent, or Firm* — Young & Thompson

(57) ABSTRACT

The electrical box (100) includes: a body (110) that presents a side wall (111) that is closed at the rear by a rear wall (112) so as to define an inside volume for receiving at least one electrical accessory. The electrical box further includes at least one metal electrical-connection element (130, 140, 150) that is fastened to the body and that includes an inside terminal for connecting the electrical accessory, and an outside terminal (132, 142, 152) that is situated outside the body for connecting an electrical conductor, the rear wall being arranged so as to provide access, via the inside volume, to the inside terminal of the metal electrical-connection element.

16 Claims, 5 Drawing Sheets

(51) Int. Cl.
*H01R 4/24* (2006.01)
*H01R 24/78* (2011.01)
*H01R 31/06* (2006.01)

(52) U.S. Cl.
CPC ............ H05K 5/0247 (2013.01); H05K 5/03 (2013.01); *H01R 4/2433* (2013.01); *H01R 24/78* (2013.01); *H01R 31/06* (2013.01)

(58) Field of Classification Search
USPC .......................................... 174/559, 59, 60
See application file for complete search history.

(56) References Cited

U.S. PATENT DOCUMENTS

| | | | | |
|---|---|---|---|---|
| 6,727,429 | B1* | 4/2004 | Koessler | H02G 3/088 |
| | | | | 174/50 |
| 6,777,611 | B2* | 8/2004 | Ewald | H01R 25/168 |
| | | | | 174/50 |
| 7,160,147 | B1 | 1/2007 | Stephan | |
| 8,802,979 | B2* | 8/2014 | Ziobro | H01R 4/22 |
| | | | | 174/53 |
| 2006/0185878 | A1 | 8/2006 | Soffer | |
| 2009/0107693 | A1* | 4/2009 | Meyer | H02G 3/123 |
| | | | | 174/60 |
| 2010/0218969 | A1* | 9/2010 | Purves | H01R 9/24 |
| | | | | 174/59 |
| 2011/0290521 | A1* | 12/2011 | Fargano | H02G 3/081 |
| | | | | 174/59 |
| 2015/0303766 | A1* | 10/2015 | Anderson | H05K 5/0247 |
| | | | | 310/71 |

\* cited by examiner

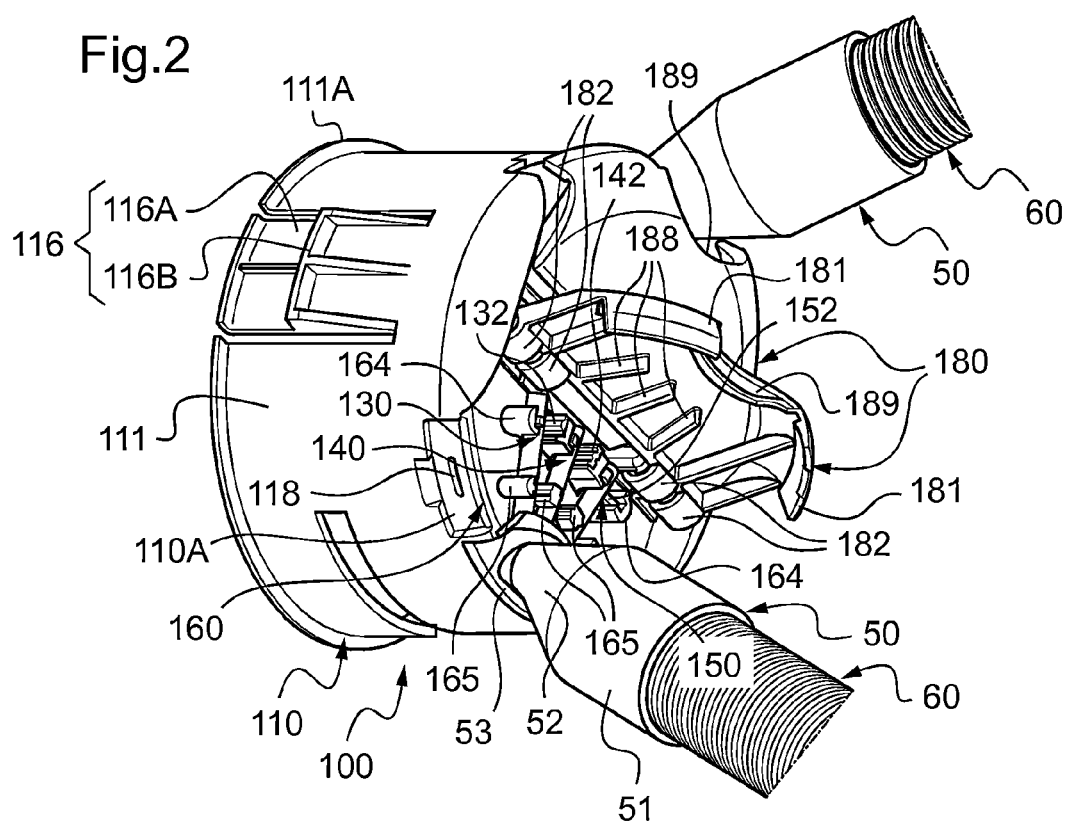

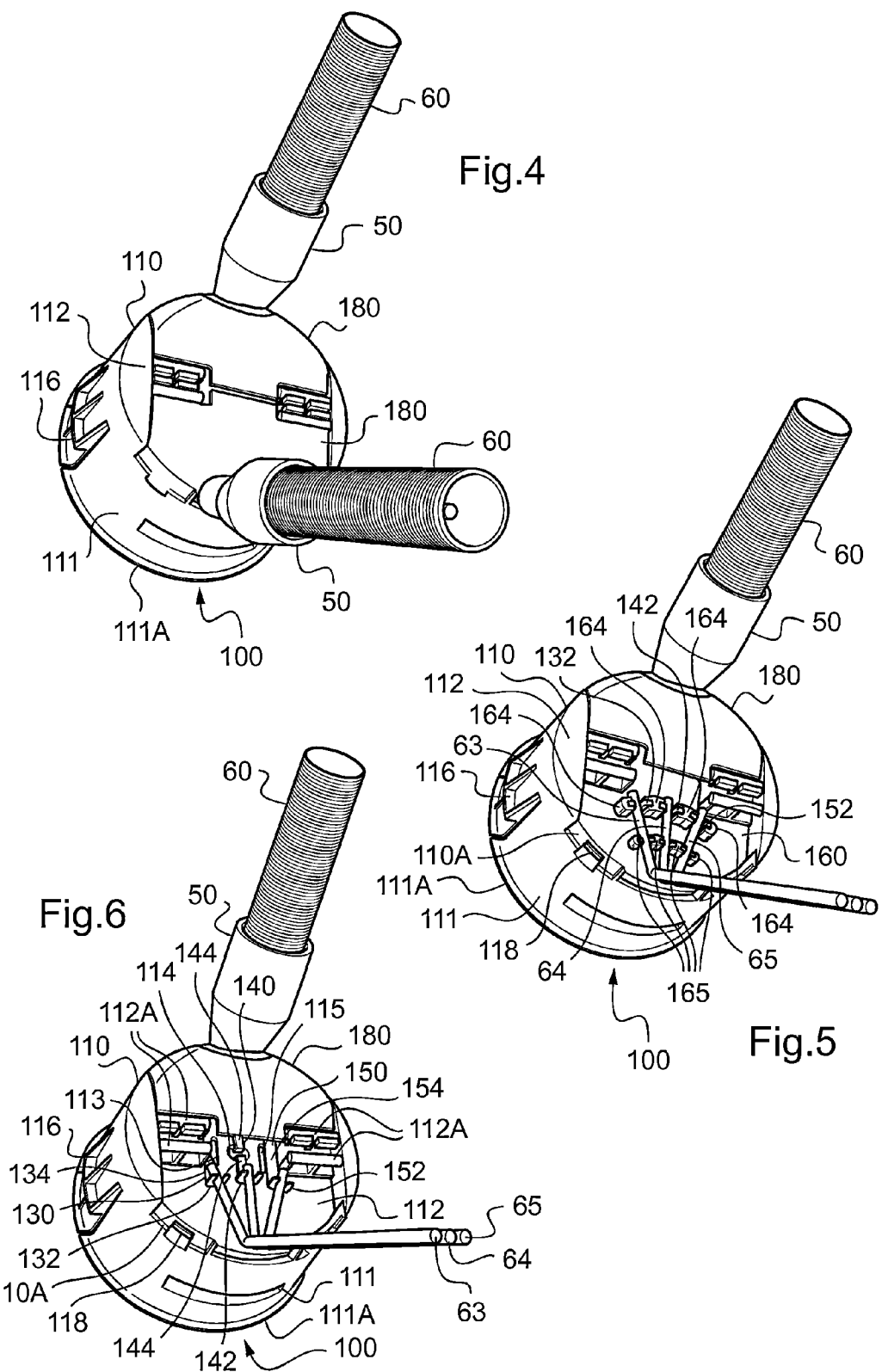

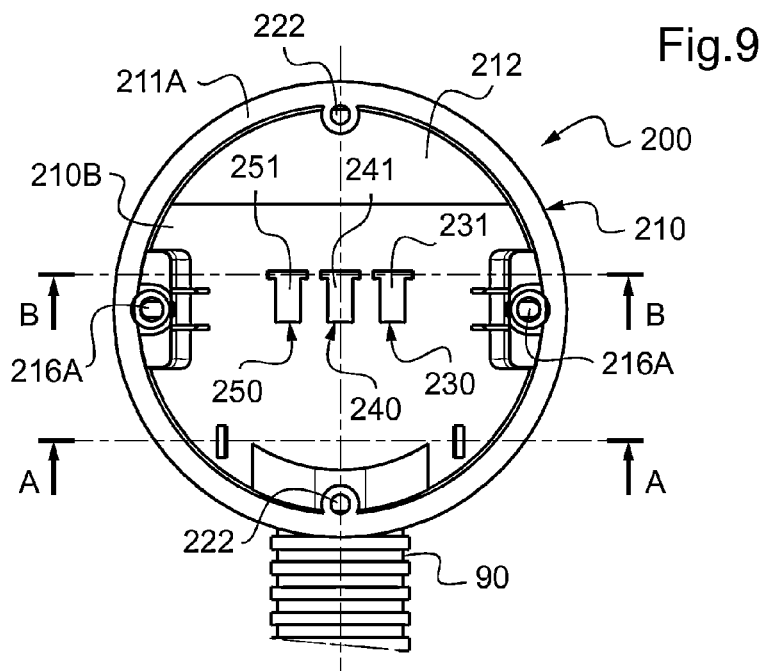
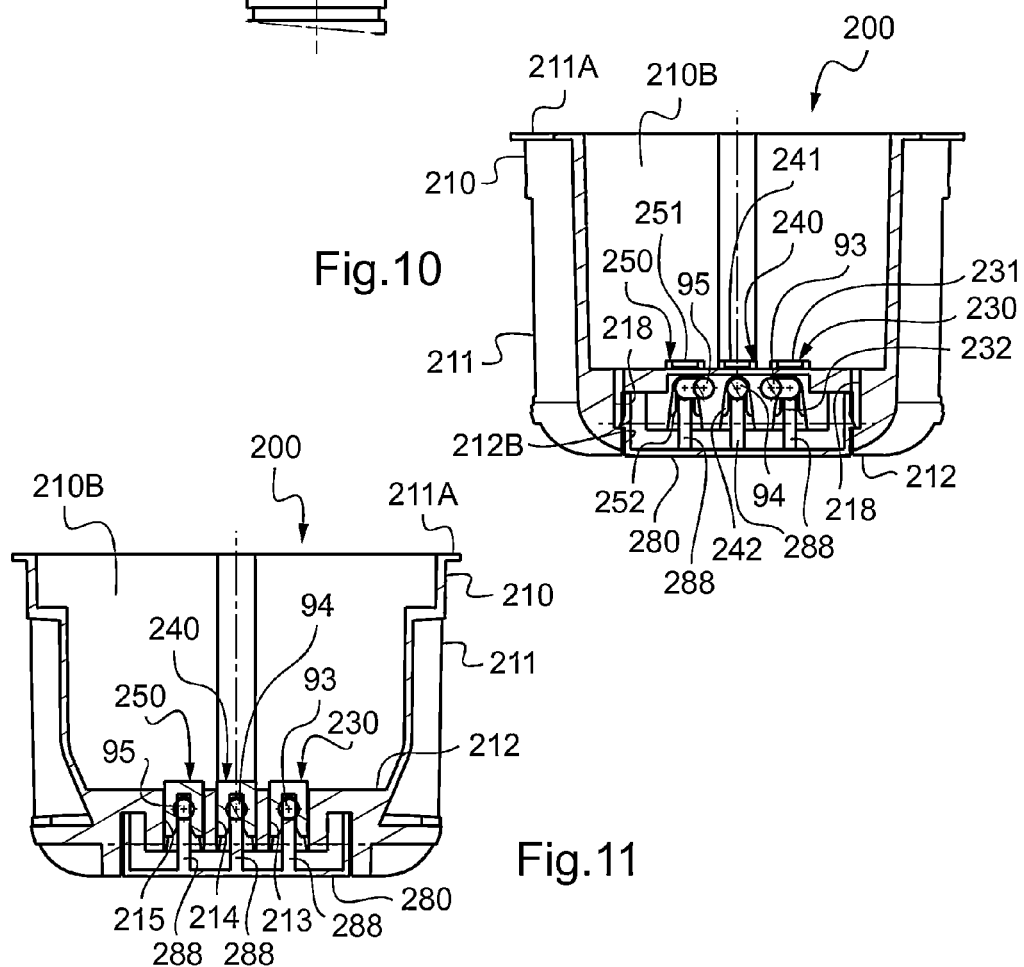

ELECTRICAL HOUSING FOR ELECTRICAL EQUIPMENT

TECHNICAL FIELD TO WHICH THE INVENTION RELATES

The present invention generally relates to flush mounting electrical accessories inside various walls.

It relates more particularly to an electrical box, comprising:
- a body that presents a side wall that is closed at the rear by a rear wall so as to define an inside volume for receiving at least one electrical accessory; and
- at least one metal electrical-connection element that is fastened to said body and that includes an inside terminal for connecting said electrical accessory, and an outside terminal that is situated outside the body for connecting an electrical conductor, said rear wall being arranged so as to provide access, via said inside volume, to the inside terminal of said metal electrical-connection element.

The invention finds a particularly advantageous application in providing an electrical box for flush mounting in a hollow partition, and for receiving various electrical accessory mechanisms such as an on/off switch, a two-way switch, a dimmer switch, a power-outlet, a network connector (RJ45), a telephone socket (RJ11), an indicator-lamp, or a detector (for detecting smoke, flood, temperature, movement, or light).

TECHNOLOGICAL BACKGROUND

Generally, the bodies of electrical boxes include internal securing means for securing an accessory support, and include external fastener means for fastening to the wall. The accessory support makes it possible to mount any type of accessory mechanism in the inside volume of the body of the electrical box, merely by snap-fastening the accessory mechanism on the accessory support.

Furthermore, and usually, the bodies of known electrical boxes include, in their rear portion, knock-out diaphragms that make it possible to open the wall of the body locally so as to insert, into its inside volume, electrical conduit from which there emerge the electrical conductors necessary for serving the accessory mechanism fitted on the accessory support.

The bodies of the electrical boxes present sizes that are standard.

Thus, currently, the bodies of a circular electrical box for flush mounting present a standard diameter of 68 millimeters (mm) and usually a depth of 40 mm.

The inside volume of the body of such an electrical box is thus small and it is awkward to house therein not only the accessory mechanism mounted on the accessory support, but also the ends of the electrical conductors that have been pulled into the inside volume of the body of the electrical box in order to connect them to the accessory mechanism, in particular because of the stiffness of the electrical conductors that need to be bent between the accessory mechanism and the rear wall of the body of the box and because of the space that the end of the conduit may occupy.

In addition, the inside volume restricts any possible development of electrical accessories that are prevented from incorporating all of the functions that might be desired, because of their limited size.

The solution currently used for housing voluminous electrical accessories thus consists in providing two electrical boxes side by side, with one housing the electrical accessory, while the other houses the electrical conductors.

However, this solution turns out to be costly and tricky to implement.

In addition, Document U.S. Pat. No. 4,669,804 discloses an electrical box that is fitted with connection terminals having electric wires coming from the local electricity network.

More precisely, the electrical box comprises a body, three electrical-connection elements, and a rear block for fitting to the rear of the body.

The body presents a side wall that is closed at the rear by a rear wall so as to define an inside volume for receiving an accessory mechanism, and that is bordered at the front by a peripheral collar that is adapted to bear against the wall surface.

The three electrical-connection elements are situated at the rear of the rear wall of the body. Each of them is accessible via the inside volume of the body, through respective ones of three slots that are provided in the rear wall of the body, and each of them includes an outside terminal.

The rear block is designed to be fitted to the rear of the body, in such a manner as to block the three electric wires in the outside terminals of the three electrical-connection elements.

The rear block is arranged in such a manner that it is not necessary to cut the three electric wires. On the contrary, provision is made to connect the electrical box on the path of the three electric wires.

The major drawback of that electrical box is that it is difficult to connect the electric wires to the outside terminals.

Specifically, connection requires having access to the rear of the wall for positioning the electric wires in the rear block, then for fitting the rear block on the body. In practice, the installer rarely has access to the rear of the wall.

Another drawback of that electrical box is that, as described, connecting the electric wires requires fitting the rear block against the body, by a movement in translation. That is why the rear body is distinct from the body and is not movably mounted thereon. The number of distinct elements to be manipulated by the installer is thus large, which complicates the installer's work and increases the risk of losing one of the components of the electrical box.

SUMMARY OF THE INVENTION

In order to remedy the above-mentioned drawbacks of the prior art, the present invention proposes a novel electrical box that firstly does not require the electrical conductors to be inserted into the inside volume of the body of the electrical box in order to connect the accessory mechanism to the local electricity network, and secondly presents a small number of separate components.

More particularly, the invention proposes an electrical box as defined in the introduction, wherein a cap is provided that is movably mounted at the rear of said body to move between an open position in which it uncovers said outside terminal, and a closed position in which it covers said outside terminal.

Thus, by means of the invention, the electrical conductors are connected to the outside of the body of the electrical box, and they do not enter the inside of said electrical box, such that the entire inside volume of the body can be used for housing a voluminous electrical accessory.

Furthermore, wiring operations turn out to be easier to implement, since they are no longer performed in or in the immediate proximity of the inside of the body, but, on the contrary, they are performed outside the body.

The use of one or more caps movably mounted on the body also makes it possible to avoid losing the cap.

Advantageously, in its closed position, each cap cooperates with the body to define a passage for electrical conductors, which passage extends, at least in part, at the rear of the electrical box.

The position of the electrical-conductor passage, at the rear of the electrical box, thus makes it possible to connect the electrical conductors to the box when said box is still situated outside the wall, and then to push the box back into the wall, without the electrical conductors presenting an obstacle to the box being pushed back.

The electrical box of the invention has other characteristics that are advantageous and non-limiting, as follows:

- each metal electrical-connection element includes at least one other outside terminal that is situated outside the body for feeding-out at least one other electrical conductor;
- another cap is provided that is movably mounted on said body, at the rear of said body, to move between an open position in which it uncovers said other outside terminal of each metal electrical-connection element, and a closed position in which it covers said other outside terminal of each metal electrical-connection element;
- each cap is pivotally mounted on said body;
- said body includes blocking means for blocking each cap in its closed position;
- said passage makes it possible to engage a guide for guiding electrical conductors, the cap and/or the body including blocking means for blocking said guide;
- each outside terminal is an insulation displacement terminal provided with perforator means for perforating an insulating sheath of said electrical conductor, and each cap includes a presser portion that is adapted to press said electrical conductor against said perforator means so as to perforate the insulating sheath of said electrical conductor by moving the cap from its open position to its closed position;
- three metal electrical-connection elements are provided that are fastened to the rear wall of the body in such a manner as to be insulated from one another electrically;
- the inside terminal of each metal electrical-connection element presents a contact face that is plane;
- each metal electrical-connection element is formed as a single piece by cutting and bending a metal sheet;
- the body is made as a single piece by molding a synthetic insulating material; and
- the body is for flush mounting, and it includes an outer peripheral rim that borders the front edge of its side wall, and catch means that project from its side wall.

The invention also proposes an electrical assembly comprising an electrical box as mentioned above, and an electrical accessory that includes fastener means that are fastened to said body, and connection means that are connected to the inside terminal of each metal electrical-connection element that is fastened to said body.

BRIEF DESCRIPTION OF THE DRAWINGS

In the accompanying drawings:

FIG. 2 is a diagrammatic rear view in perspective of the FIG. 1 electrical box, in which one of the caps of the electrical box is open;

FIG. 3 is a diagrammatic front view in perspective of the FIG. 1 electrical box in its flush-mounted position in a wall, and of the FIG. 1 electrical accessory;

FIG. 4 is a diagrammatic rear view in perspective of the FIG. 1 electrical box, in which the caps of the electrical box are closed;

FIG. 5 is a view similar to the view in FIG. 4, in which one of the caps has been removed;

FIG. 6 is a view similar to the view in FIG. 5, in which a rear plate of the electrical box has also been removed;

FIG. 9 is diagrammatic front view of the FIG. 7 electrical box; and

FIGS. 10 and 11 are diagrammatic section views on planes A-A and B-B in FIG. 9.

DETAILED DESCRIPTION OF THE PREFERRED EMBODIMENTS

The following description of non-limiting examples given with reference to the accompanying drawings, makes it possible to understand what the invention comprises and how it can be reduced to practice.

Installing an electrical accessory in a wall requires the use of an electrical box. Such an electrical box makes it possible not only to fasten the electrical accessory rigidly in the wall, but also to protect it.

The term "electrical accessory" means any type of accessory, such as a power outlet, an on/off switch, a two-way switch, a dimmer switch, a network connector (RJ45), a telephone socket (RJ11), an indicator lamp, or a detector (for detecting smoke, flood, temperature, movement, or light).

FIGS. 1 to 6 and FIGS. 7 to 11 respectively show two embodiments of an electrical box 100; 200 for receiving an electrical accessory 10; 70.

Both embodiments relate to an electrical box for flush mounting inside a cavity formed in a wall surface.

In the description, the terms "front" and "rear" are thus used relative to the direction in which the electrical box in the cavity faces the installer. In the embodiments shown, the terms "front" and "rear" thus designate the locations facing the installer of the electrical box and the locations facing the rear of the cavity respectively.

Figure 1:
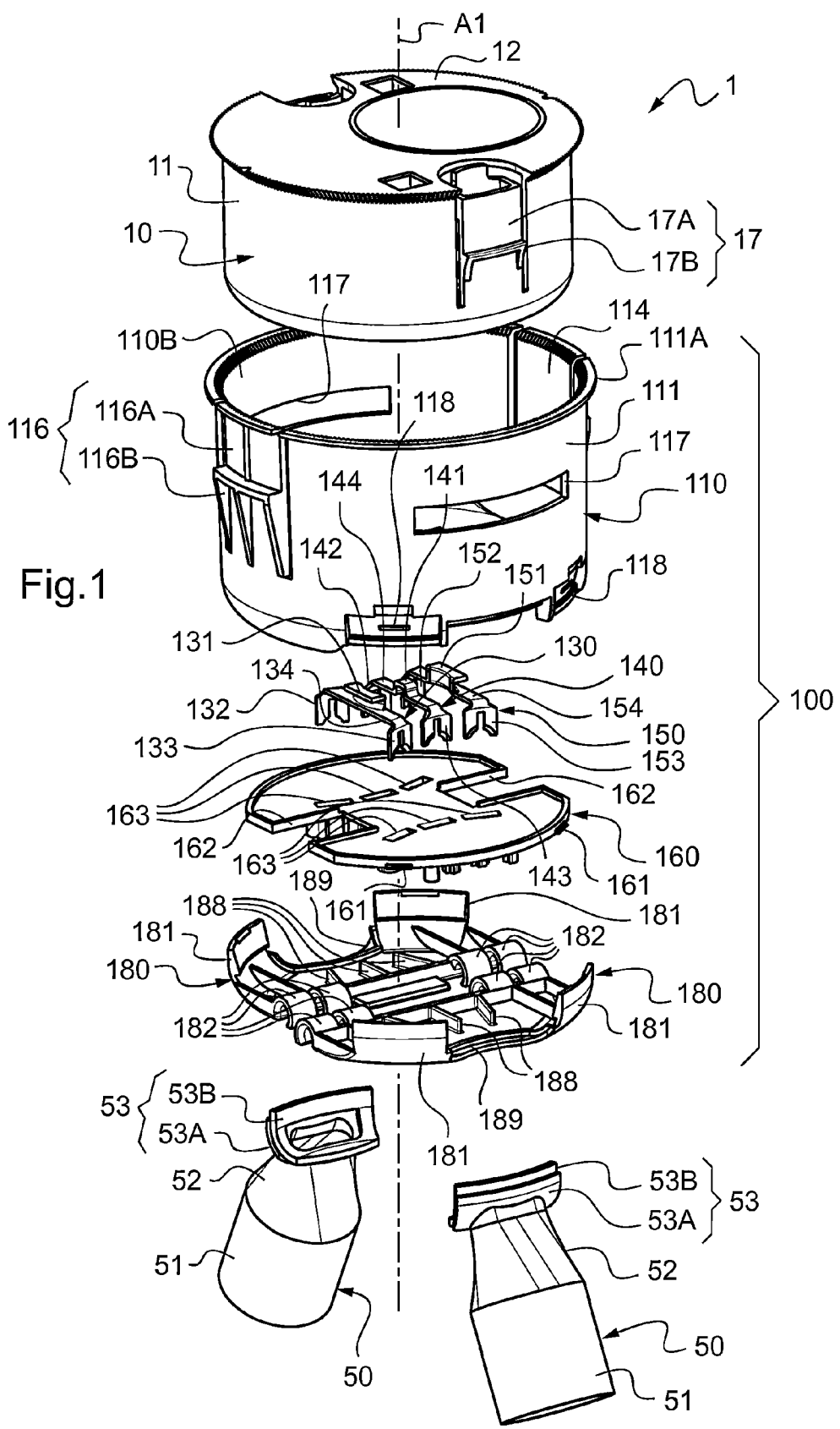
FIG. 1 is an exploded diagrammatic perspective view of a first embodiment of an electrical box of the invention, said figure also showing an electrical accessory.
Figure 7:
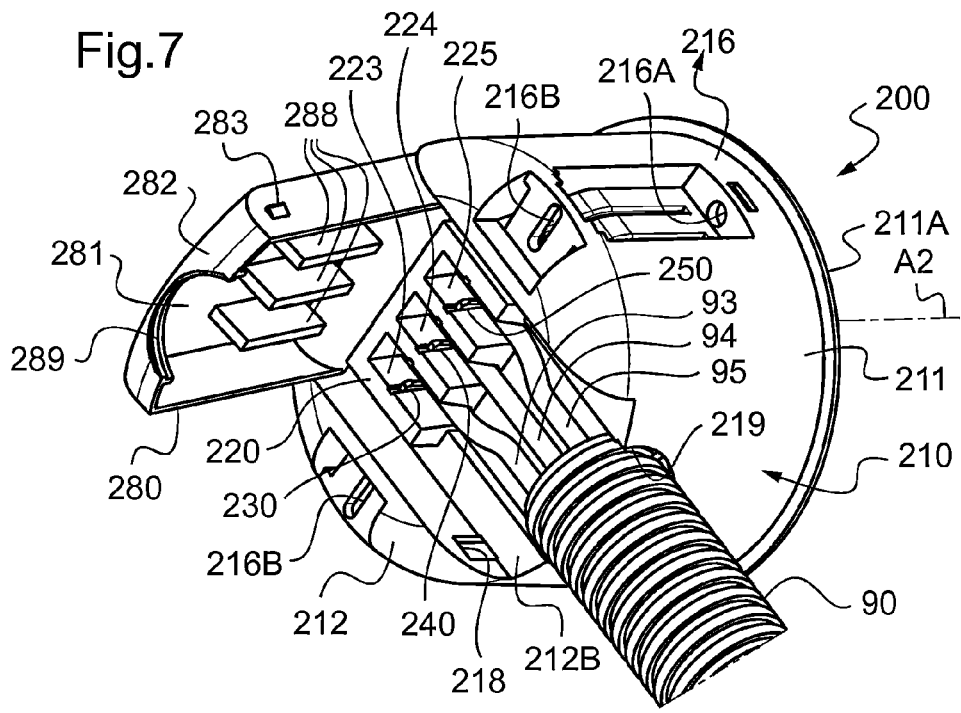
FIG. 7 is a diagrammatic rear view in perspective of a second embodiment of the electrical box of the invention.

As shown more particularly in FIGS. 1 and 7, in both embodiments, the electrical box 100; 200 includes a body 110; 210 that presents a shape that is generally cylindrical, but naturally it could present some other shape, in particular a shape that is a rectangular parallelepiped.

The body comprises a side wall 111; 211 that is circularly tubular about an axis A1; A2, and that is closed at the rear by a rear wall 112; 212.

In order to fasten it in the cavity formed in the wall surface, the body 110; 210 includes a peripheral rim 111A; 211A that externally borders the front edge of its side wall 111; 211, and that is adapted to bear against the front face of the wall surface, all around the cavity. Thus, the peripheral rim 111A; 211A makes it possible to hold the body 110; 210 of the electrical box 100; 200 against rearwards movement in its cavity.

In order to hold it against forwards movement, the body 110; 210 includes catch means 116; 216 that are adapted to catch onto the inside of the cavity. The catch means 116; 216 are described more precisely in the description below.

According to a particularly advantageous characteristic of the invention, the electrical box 100; 200 includes at least one metal electrical-connection element 130, 140, 150; 230, 240, 250 that is fastened to the body 110; 210 and that includes an inside terminal 131, 141, 151; 231, 241, 251 for connecting said electrical accessory 10; 70, and an outside terminal 132, 142, 152; 232, 242, 252 that is situated outside the body 110; 210 for connecting an electrical conductor 63, 64, 65; 93, 94, 95 (specifically an insulated electric wire), said rear wall 112; 212 being arranged so as to provide access, via the inside volume 110B; 210B of the body 110; 210, to the inside terminal 131, 141, 151; 231, 241, 251 of said metal electrical-connection element 130, 140, 150; 230, 240, 250.

More precisely, in both of the embodiments shown, three metal electrical-connection elements 130, 140, 150; 230, 240, 250 are provided, i.e. line, neutral, and earth. The three metal electrical-connection elements thus make it possible to connect three electrical conductors 63, 64, 65; 93, 94, 95 (that are connected to the local electricity network) to the rear of the box, such that, inside the body of the electrical box, the inside terminals of the three metal electrical-connection elements provide the electrical accessory 10; 70 with access to the local electricity network.

Preferably, the electrical box 100; 200 also includes a cap 180; 280 that is movably mounted at the rear of the body 110; 210, to move between an open position in which it uncovers the outside terminal 132, 142, 152; 232, 242, 252 of each metal electrical-connection element 130, 140, 150; 230, 240, 250, and a closed position in which it covers the outside terminal 132, 142, 152; 232, 242, 252.

The cap 180; 280 thus makes it possible to protect the zone in which the electrical conductors 63, 64, 65; 93, 94, 95 are connected to the outside terminals 132, 142, 152; 232, 242, 252 of the metal electrical-connection elements 130, 140, 150; 230, 240, 250.

The body 110; 210, the metal electrical-connection elements 130, 140, 150; 230, 240, 250, and each cap 180; 280 are described better in the description below, in association with the two embodiments shown in the figures.

As shown in FIGS. 1 and 3, in the first embodiment, the electrical box 100 is designed to receive an electrical accessory 10.

The electrical accessory 10 comprises a cylindrical skirt 11 that is closed at the front by a front wall 12 and that is open at the rear, and a cover (not shown in the figures) that closes the rear opening of the skirt 11.

The skirt 11 houses an accessory mechanism that gives the electrical accessory its function (power outlet, switch, . . . ).

In this embodiment, the front wall 12 presents a circular opening through which the functional portion of the accessory mechanism emerges. In this embodiment, since the accessory mechanism is a power-outlet mechanism, the functional portion is formed by a reception well for receiving an electric plug.

Since the electrical accessory 10 is not the subject of the present invention, it is not described in greater detail herein.

As shown in FIG. 1, in order to block the electrical accessory 10 in the body 110, the electrical box 100 includes suitable fastener means that, in this embodiment, are in the form of two rectangular slots 117 that are cut out in the side wall 111 of the body 110.

The two rectangular slots 117 are situated in diametrally-opposite manner relative to the axis A1. They run parallel to the peripheral rim 111A in such a manner that corresponding snap-fastener means 17 provided on the skirt 11 of the electrical accessory 10 can catch thereon.

Specifically, the snap-fastener means 17 comprise two flexible tabs 17A that are cut out in the side wall of the skirt 11 of the electrical accessory 10, each of them carrying, on its outside face, a snap-fastener tooth 17B.

The two flexible tabs 17A are situated in diametrally-opposite manner relative to the axis A1, and they extend lengthwise from the front edge of the side wall of the skirt 11 towards the rear. Each flexible tab 17A presents the shape of a rectangle having three edges that are free, and having a fourth edge, namely the rear edge in this embodiment, that is connected to the side wall of the skirt 11, so as to form a hinge.

Each snap-fastener tooth 17B is situated at a distance from the rear edge of its corresponding flexible tab 17A. Each snap-fastener tooth 17B presents a front face that is plane and orthogonal to the axis A1, and that is adapted to catch onto the front edge of the corresponding rectangular slot 117 of the body 110, and a rear face that slopes relative to the axis A1, and that forms a ramp that enables the flexible tab 17A to deform resiliently inwards when the skirt 11 is engaged in the body 110.

As shown in FIG. 1, in the first embodiment, the electrical box 100 is designed to be flush mounted in a hollow partition.

On this topic, it should be observed that, in known manner, such a hollow partition is generally made up of a metal frame (formed of vertical uprights and horizontal rails) and plasterboards that are fitted on at least one of the two faces of the metal frame.

The cavity formed in the hollow partition is thus formed merely by a circular opening that is made with a crown saw in one of the plasterboards.

The catch means 116 that fasten the body 110 of the electrical box 100 in the circular opening, and that make it possible to hold the body 110 against forwards movement, are thus formed by snap-fastener means 116 in this embodiment.

Specifically, the snap-fastener means 116 comprise two flexible tabs 116A that are cut out in the side wall of the body 110, each of them carrying, on its outside face, a snap-fastener tooth 116B.

The two flexible tabs 116A are situated in diametrally-opposite manner relative to the axis A1, and they extend lengthwise from the front edge of the side wall of the body 110 towards the rear. Each flexible tab 116A presents the shape of a rectangle having three edges that are free, and having a fourth edge, namely the rear edge in this embodiment, that is connected to the side wall of the body 110, so as to form a hinge.

Each snap-fastener tooth 116B is thus situated in the proximity of the front edge of its corresponding flexible tab 116A. Each snap-fastener tooth 116B presents a front face that is plane and orthogonal to the axis A1, and that is adapted to catch onto the rear face of the corresponding plasterboard, and a rear face that slopes relative to the axis A1, and that forms a ramp that enables the flexible tab 116A to deform resiliently inwards when the body 110 is engaged in the circular opening formed in the plasterboard.

As shown clearly in FIG. 3, in its rear wall 112, the body 110 presents three openings 113, 114, 115 that are in alignment, and through which the three metal electrical-connection elements 130, 140, 150 are engaged and fastened respectively.

As shown in FIG. 1, each of the three metal electrical-connection elements 130, 140, 150 comprises, in addition to a feed-in inside terminal 131, 141, 151 and a feed-in outside terminal 132, 142, 152, a feed-out outside terminal 133, 143, 153.

While the feed-in outside terminal 132, 142, 152 of each metal electrical-connection element 130, 140, 150 is designed to be connected to an electrical conductor that is connected to the local electricity network so as to feed the corresponding inside terminal 131, 141, 151 with electricity, the feed-out outside terminal 133, 143, 153 makes it possible to add another electrical box by branching out from the electrical box 100 under consideration.

In a variant, naturally, provision could be made for each of the three metal electrical-connection elements to comprise only a feed-in inside terminal and a feed-in outside terminal.

As shown in FIGS. 1 and 6, each of the three metal electrical-connection elements 130, 140, 150 is formed as a single piece that is obtained by cutting and bending a copper sheet in this embodiment.

The three metal electrical-connection elements 130, 140, 150 present shapes that are similar.

Thus, each metal electrical-connection element 130, 140, 150 comprises a main blade 134, 144, 154 of shape that is rectangular, and that is flattened against the rear face of the rear wall 112 of the body 110 so as to extend in a plane that is orthogonal to the axis A1. The central portion of the main blade 134, 144, 154 carries a platform that is situated at the front of the main blade and that is engaged through the corresponding opening 113, 114, 115 provided in the rear wall 112 of the body 110. Both ends of the main blade are themselves bent at right angles towards the rear. The platform carried by the main blade forms the inside terminal 131, 141, 151 of the metal electrical-connection element 130, 140, 150. As shown in FIG. 3, its plane form enables simple electrical contacts provided at the rear of the skirt 11 of the electrical accessory 10 to connect thereto.

The two ends of the main blade form the feed-in and feed-out outside terminals 132, 142, 152; 133, 143, 153 of the metal electrical-connection element 130, 140, 150.

The feed-in and feed-out outside terminals 132, 142, 152; 133, 143, 153 are in the form of blades that are slotted so as to displace insulation.

As shown more particularly in FIG. 1, the rear side of each outside terminal 132, 142, 152; 133, 143, 153 includes a slot that presents a V-shaped opening having two side edges that are sharp so as to cut the insulating sheath of the electrical conductor. The end wall of the slot is itself rectangular so as to come into contact with the conductive core of the electrical conductor so as to establish a connection between the outside terminal and the electrical conductor.

As shown in FIG. 1, in order to hold the metal electrical-connection elements 130, 140, 150 in place through the openings 113, 114, 115 formed in the rear wall 112 of the body 110, in this embodiment a rear plate 160 is provided that is generally circular, having a front face that is adapted to bear against the rear faces of the main blades 134, 144, 154 of the metal electrical-connection elements 130, 140, 150.

In this embodiment, the rear plate 160 is fastened against the rear wall 112 of the body 110 by means of four snap-fastener teeth 161 that project from the edge of the rear plate 160, and that are adapted to snap-fasten in four corresponding housings provided in the rear wall 112 of the body 110.

The rear plate 160 presents two diametrally-opposite notches 162 through which there pass four pins 112A (see FIG. 6) that are carried by the rear wall 112 of the body 110, said rear plate having a function that is described in detail below.

The rear plate 160 also presents six slots 163 through which there pass the six feed-in and feed-out outside terminals 132, 142, 152; 133, 143, 153 of the metal electrical-connection elements 130, 140, 150, so that the terminals are accessible at the rear of the rear plate 160.

As shown in FIGS. 2 and 5, projecting from its rear face, the rear plate 160 carries grooved lugs 164, in the grooves of which the side edges of the feed-in and feed-out outside terminals 132, 142, 152; 133, 143, 153 are engaged, thereby making it possible to stiffen the outside terminals. Projecting from its rear face, the rear plate also includes lugs 165 that are regularly spaced apart, and that make it possible to block the electrical conductors 63, 64, 65 on the axes of the feed-in and feed-out outside terminals 132, 142, 152; 133, 143, 153.

In the first embodiment of the electrical box 100, two caps 180 are provided, one of which is adapted to cover the feed-in outside terminals 132, 142, 152 of the metal electrical-connection elements 130, 140, 150, while the other one is adapted to cover the feed-out outside terminals 133, 143, 153 of the metal electrical-connection elements 130, 140, 150.

Each cap 180 generally presents the shape of a half-disk, for covering substantially half of the rear face of the rear wall 112 of the body 110. Each cover 180 thus presents one edge that is straight and another edge that is semi-circular.

When the caps 180 are in their closed positions on the rear wall of the body, the electrical box 100 presents standard dimensions, i.e. an outside diameter of 68 mm and a depth of 40 mm.

Each of the caps 180 is pivotably mounted at the rear of the body 110, to pivot about an axis that is parallel to its straight edge, between an open position and a closed position.

The four above-described pins 112A, which can be seen clearly in FIGS. 5 and 6, are designed to enable such pivoting.

For this purpose, each of the pins 112A is in the form of a cylindrical rod of axis that is orthogonal to the axis A1, which rod is held at a distance from the rear face of the rear wall 112 of the body 110 by spacers.

Two pins 112A are thus provided on a common axis, so as to enable each cap 180 to pivot. The two pins 112A of each cap 180 are in alignment along two parallel axes, situated at a small distance apart.

As shown in FIG. 2, along its straight edge, each cap 180 includes four hooks 182 that form bearings for receiving the pins 112A for pivoting the cap 180 on the body 110. The hooks 182 are snap-fastened in pairs on the two corresponding pins 112A.

In the open position (FIG. 2), each cap 180 generally extends at right angles relative to the rear wall 112 of the body 110.

In the closed position (see FIG. 4), each cap 180 generally extends parallel to the rear wall 112.

The body 110 thus includes blocking means 118 for blocking each cap 180 in its closed position, which blocking means are formed by snap-fastener means, in this embodiment.

As shown more precisely in FIG. 2, the body 110 presents four rectangular setbacks 110A that are distributed regularly about the axis A1, and that are situated at the junction between its side wall 111 and its rear wall 112. The snap-fastener means thus comprise four teeth 118 that project from the center of the four rectangular setbacks 110A respectively.

As shown in FIG. 1, each cap 180 includes two corresponding rectangular panels 181 that project from its semi-circular edge, orthogonally thereto, and that present shapes that are complementary to the shapes of the rectangular setbacks 110A, in particular with a central cavity (not shown in the figures) that is set back into the inside face.

When the caps 180 are folded down in their closed positions, the rectangular panels 181 are thus adapted to become housed in the rectangular setbacks 110A, so that the teeth 118 that project from the rectangular setbacks 110A of the body 110 snap-fasten in the cavities that are set back into the rectangular panels 181 of the caps 180.

As also shown in FIG. 2, the inside face (facing towards the rear wall of the body 110) of each cap 180 carries three bearing splines 188. The bearing splines 188 are situated so that, when the cap 180 is folded down in its closed position, they are engaged between the cutting edges of the V-shaped openings of the three corresponding feed-in and feed-out outside terminals 132, 142, 152, 133, 143, 153, without however coming into contact with said outside terminals.

Thus, by closing the cap 180, the bearing splines 188 are adapted to push the insulated electrical conductors 63, 64, 65 between the cutting edges, thereby cutting their insulating sheaths and connecting their conductive cores to the feed-in and feed-out outside terminals 132, 142, 152; 133, 143, 153 of the metal electrical-connection elements 130, 140, 150.

In order to avoid the cap 180 crushing the insulated electrical conductors 63, 64, 65 in its closed position, each cap 180 co-operates with the body 110 to define a passage for the insulated electrical conductors 63, 64, 65. The passage extends, at least in part, over the rear of the electrical box. In this way, the insulated electrical conductors 63, 64, 65 do not enter into the electrical box laterally, but, on the contrary, either via the rear of the box, or in a manner sloping relative to the rear wall 112 of the body 110 of the electrical box 110.

In this embodiment, the passage straddles the side and the rear of the electrical box, such that the insulated electrical conductors 63, 64, 65 enter into the electrical box in a manner sloping relative to the rear of the box.

More precisely, the passage is designed to make it possible to engage a guide 50 through which the insulated electrical conductors 63, 64, 65 are routed.

As shown in FIG. 2, for this purpose, each cap 180 presents a curved notch 189 at the center of its semi-circular edge.

As shown in FIGS. 1 and 2, in this embodiment, each guide is formed by an endpiece 50 that is adapted to be engaged through the curved notch 189, and that is mounted at the end of an electrical conduit 60.

In this embodiment, the electrical conduit 60 under consideration is a ringed conduit made of flexible plastics material.

The endpiece 50 presents three distinct portions that are situated in alignment with one another, i.e. a tubular portion 51, a conical portion 52, and a fastener portion 53. The tubular portion 51 presents a diameter such that it can be engaged on the end of the electrical conduit 60. Internally, it presents projections that are adapted to engage in the grooves provided in the electrical conduit 60, thereby making it possible to fasten the endpiece 50 on the end of the electrical conduit 60.

From the tubular portion 51 to the fastener portion 53, the conical portion 52 presents a section that decreases and that flattens. It thus opens out to the fastener portion 53 via an oblong opening that forces the insulated electrical conductors 63, 64, 65 to exit the endpiece 50 in a juxtaposed position.

The fastener portion 53 is in the form of two superposed plates 53A, 53B that are generally rectangular and curved, and that extend substantially orthogonally to the axis along which the insulated electrical conductors 63, 64, 65 exit.

The plate 53A situated beside the conical portion 52 presents a shape such that, when the cap 180 is folded down in its closed position, it bridges the gap defined between the curved notch 189 of the cap 180 and the body 110 in continuous manner.

The other plate 53B presents dimensions that are greater, such that it can be engaged in a groove 119 that is set back into the body 110, thereby blocking the endpiece 50 in stationary manner between the body 110 and the cap 180, when the cap 180 is in its closed position.

In this embodiment, the body 110, the rear plate 160, and the caps 180 of the electrical box 100 are each made as a single piece by molding an insulating plastics material.

The electrical box 100 is thus installed in a circular opening formed in plasterboard of a hollow partition as follows.

One or two electrical conduits 60, each housing three insulated electrical conductors 63, 64, 65, i.e. line, neutral, and earth, are initially pulled outside the hollow partition, through the circular opening.

The installer then engages an endpiece 50 on the end of each electrical conduit 60, taking care to pass the three insulated electrical conductors that are housed in the electrical conduit 60 through the endpiece 50.

The installer then opens the cap(s) 180 of the electrical box 100 so as to uncover the outside terminals of the metal electrical-connection elements 130, 140, 150, and engages the ends of the insulated electrical conductors 63, 64, 65 between the lugs 165 of the rear plate 160, in such a manner that their unstripped ends are inserted between the cutting edges of the V-shaped opening of the outside terminals.

The installer then closes the cap(s) 180, taking care that the fastener portion 53 of each endpiece 50 is positioned correctly between the corresponding cap 180 and the body 110, thereby ensuring that each endpiece 50 is held in stationary manner.

During closing, the splines 188 provided inside the cap(s) 180 serve to force the insulating sheath of the insulated electrical conductors 63, 64, 65 to be cut through, in such a manner that the conductive cores of the insulated electrical conductors 63, 64, 65 are connected automatically to the metal electrical-connection elements 130, 140, 150.

The lugs 165 make it possible to block the electrical conductors 63, 64, 65 on the axes of the feed-in and feed-out outside terminals 132, 142, 152; 133, 143, 153, so that the electrical conductors 63, 64, 65 do not escape from the terminals when the caps 180 are closed on said conductors.

The caps 180 are thus held in their closed positions by the snap-fastener means 118.

Once the electrical box 100 is connected in this way to the local electricity network, it is then engaged in the circular opening formed in the plasterboard of the hollow partition. Such engagement is not hindered by the insulated electrical conductors 63, 64, 65 since, as a result of the flexibility of the conductors, the flexibility of the endpieces 50, and the position of the endpieces 50 at the rear of the box, it is possible to flex the endpieces 50 towards the rear so that they can easily be forced back through the circular opening formed in the plasterboard of the hollow partition.

The electrical box 100 is engaged properly in the circular opening when the peripheral rim 111A of its body 110 comes into contact with the front face of the plasterboard, and when the teeth 116B of the snap-fastener means 116 of the body 110 catch onto the rear face of the plasterboard.

Thus, the electrical box 100 is ready to receive the electrical accessory 10, in such a manner that the two elements form a rigid assembly 1 that is fastened properly in the hollow partition.

Figure 8:
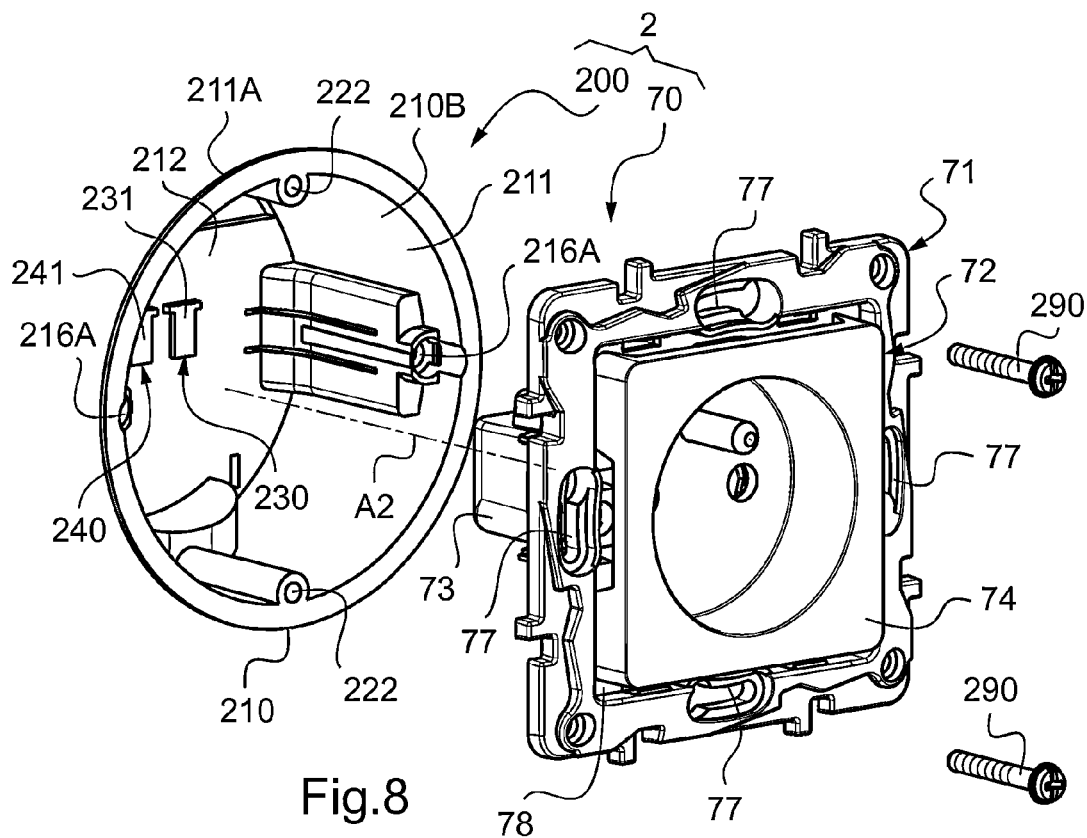
FIG. 8 is a diagrammatic front view in perspective of the FIG. 7 electrical box in its flush-mounted position in a wall, said figure also showing an electrical accessory.

As shown in FIG. 8, in the second embodiment of the invention, the electrical box 200 is designed to receive an electrical accessory 70 that is different from the electrical accessory shown in FIG. 1.

In this embodiment, the accessory mechanism 72 of the electrical accessory 70 is also a power-outlet mechanism. It comprises a back plate 73 that is generally in the form of a rectangular parallelepiped, that is closed at the front by a trim plate 74 that presents a well for inserting an electric plug, and that internally houses electrical terminals for connecting the electric plug.

The accessory support 71 for supporting the electrical accessory 70 is used to mount the accessory mechanism 72 inside the electrical box 200.

For this purpose, the accessory support is in the form of a flat frame of shape that is square in this embodiment, and that defines a central opening that is also square.

The accessory support 71 includes blocking means 78 for fastening the accessory mechanism 72 in its frame, and securing means 77 for fastening it to the electrical box 200.

The blocking means comprise an inner collar 78 that borders the inner peripheral edge of the frame, and having a front face against which the trim plate 74 of the accessory mechanism 72 can bear. Snap-fastener means provided on the rear base 73 of the accessory mechanism 72 are thus adapted to catch onto the rear face of the inner collar 78, so as to block the accessory mechanism 72 rigidly inside the accessory support 71.

In this embodiment, at the center of each of the four branches of the frame, the securing means include an orifice 77 in the form of a key hole.

The electrical box 200 correspondingly includes two diametrally-opposite screw-fastener wells 222 of axes that are parallel to the axis A2, and that extend along the inside face of the side wall 211 of the body 210. The two screw-fastener wells 222 project from the rear wall 212 of the body 210 until they reach the peripheral rim 211A.

The two screw-fastener wells 222 are adapted to receive the threaded shanks of two screws 290 having heads that thus bear around the key hole orifices 77 of the accessory support 71, so as to fasten the electrical accessory 70 rigidly in the electrical box 200.

In this second embodiment, the electrical box 200 is also designed to be flush mounted in a cavity formed by a circular opening formed in plasterboard of a hollow partition.

In this embodiment, the catch means 216 for catching the body 210 in the circular opening comprise two grip screws (not shown) that are housed in two diametrally-opposite setbacks 216 in the outside face of the side wall 211 of the body 210.

In known manner, each grip screw comprises a screw and a catch that, when the screw is screw-tightened by the installer, travels along the length of said screw so as to catch onto the rear of the plasterboard of the hollow partition.

As shown in FIG. 7, the setbacks 216 present shapes that are generally rectangular parallelepipeds, and that extend lengthwise from the rear of the peripheral rim 211A of the body 210 until they reach the proximity of the rear wall 212 of the box.

In order to avoid the catch hindering the insertion of the body 210 in the circular opening formed in the plasterboard of the hollow partition, the setbacks 216 are deeper in the proximity of the rear wall 212 of the body 210 than in the proximity of the peripheral rim 211A. Thus, before mounting the body 210 in the circular opening, the catches are housed entirely in the setbacks 216 and they do not project from the side wall 211. Then, when the screws are tightened by the installer, the catches travel along the length of the screws and deploy outwards, projecting from the side wall 211.

The wall that defines the front of each setback 216 is open via a circular opening 216A for passing the screw, while the wall that defines the rear of each setback 216 is open via an oblong opening 216B for passing the end of the screw. The oblong shape of the second opening enables the screw to pivot outwards a little when the catch deploys, projecting from the side wall 211 of the body 210.

As shown clearly in FIGS. 7 and 10, the body 210 presents a rear wall 212 that is thick, and that presents, set back into its rear face, a large groove 212B of rectangular section that extends from one side of the body 210 to the other.

In its middle, the large groove 212B presents an element 220 that is comb shaped, that extends over the entire width of the groove 212B, and that defines three channels 223, 224, 225 that are open towards a first end of the groove 212B.

The three channels 223, 224, 225 make it possible to receive the ends of three insulated electrical conductors 93, 94, 95.

As shown in FIG. 11, three slots 213, 214, 215 are provided in the center of the rear wall 212 of the body 210 that are coplanar, and each of them opens out into one of the three channels 223, 224, 225. The three metal electrical-connection elements 230, 240, 250 are force-fitted in the three slots 213, 214, 215.

In this second embodiment, each of the three metal electrical-connection elements 230, 240, 250 comprises a single feed-in inside terminal 231, 241, 251 and a single feed-in outside terminal 232, 242, 252. In contrast, a feed-out outside terminal is not provided.

As shown clearly in FIGS. 8 and 11, each of the three metal electrical-connection elements 230, 240, 250 is formed by a folded metal plate that is obtained by cutting and bending a copper sheet into an L-shape in this embodiment.

The three metal electrical-connection elements 230, 240, 250 present shapes that are identical, with a first branch of the L-shape forming the inside terminal 231, 241, 251, and a second branch of the L-shape forming the outside terminal 232, 242, 252.

As shown in FIG. 8, the inside terminal 231, 241, 251 of each metal electrical-connection element 230, 240, 250 is thus formed by a simple rectangular metal blade that bears against the front face of the rear wall 212 of the body 210.

As shown in FIG. 11, the outside terminal 232, 242, 252 of each metal electrical-connection element 230, 240, 250 is formed by a metal blade having an end that is cut in such a manner as to displace insulation. The shape of the end is identical to the shape of the ends of the outside terminals of the metal electrical-connection elements of the electrical box 100 shown in FIG. 1.

As shown in FIG. 11, the slots 213, 214, 215 provided in the rear wall 212 of the body 210 present sizes that are adjusted such that they hold the metal electrical-connection elements 230, 240, 250 merely by co-operation between shapes. However, a drop of adhesive could be added while mounting the metal electrical-connection elements in the slots to as to provide better fastening.

In this embodiment, the channels 223, 224, 225 provided in the rear wall 212 of the body 210 present widths that are smaller than the widths of the outside terminals 232, 242, 252. Their edges are thus notched so as to enable the outside terminals 232, 242, 252 to pass through, and so as to optimize the stiffness of said outside terminals.

In this embodiment of the electrical box 200, a single cover 280 is provided that is adapted to close the groove 212B, so as to cover the channels 223, 224, 225 and the outside terminals 232, 242, 252 of the metal electrical-connection elements 230, 240, 250.

As shown in FIG. 7, for this purpose the cap 280 includes a main wall 281 having a generally-rectangular outline that presents a shape that is complementary to the shape of the groove 212B. It also includes a peripheral rim 282 that borders one side of the main wall 281.

The cap 280 is mounted to pivot in the groove 212B. For this purpose, its peripheral rim 282 carries two pivot pins on a common axis (not shown in the figures) that project from two opposite sides of its outside face, and that are engaged in two circular openings (not shown in the figures) that are provided in the side walls of the groove 212B, in the proximity of its first end.

The body 210 thus includes snap-fastener means 218 for snap-fastening the cap 280 in its closed position.

In this embodiment, the snap-fastener means are formed by two square slots 218 that are situated in the side walls of the groove 212B, in the proximity of its second end. They are provided to receive two snap-fastener teeth 283 that are provided on the two opposite sides of the outside face of the peripheral rim 282 of the cap 280, remote from the pivot pins.

When the cap 280 is in its closed position, the electrical box 200 presents standard dimensions, i.e. an outside diameter of 68 mm and a depth of 40 mm.

As also shown in FIG. 7, projecting from the inside face of its main wall 281, the cap 280 includes three bearing splines 288 that are situated so that, when the cap 280 is folded down in its closed position, they are engaged in the channels 223, 224, 225, between the cutting edges of the V-shaped openings of the three outside terminals 232, 242, 252, without however coming into contact with said outside terminals.

Thus, by closing the cap 280, the bearing splines 288 make it possible to push the insulated electrical conductors 93, 94, 95 between the cutting edges, thereby cutting through their insulating sheaths and connecting their conductive cores to the outside terminals of the metal electrical-connection elements.

In order to avoid the cap 280 crushing the insulated electrical conductors 93, 94, 95 in its closed position, the cap 280 co-operates with the body 210 to define a passage for a cable-routing guide 90, through which the insulated electrical conductors 93, 94, 95 are routed.

In this embodiment, the cable-routing guide 90 is formed by a ringed conduit made of flexible plastics material.

As shown in FIG. 7, the cap 280 thus presents a semi-circular notch 289 that is set back into its peripheral rim 282. At its second end, the groove 212B presents a widening 219 of its section.

The notch 289 and the widening 219 co-operate with each other to define a passage for the cable-routing guide 90.

In this embodiment and ignoring assembly clearance, the semi-circular notch 289 presents a diameter that is equal to the outside diameter of the grooves of the cable-routing guide 90, so it is thus designed to be engaged in one of the grooves, so as to block the cable-routing guide 90 in the electrical box 200 in stationary manner.

In this embodiment, the body 210 and the cap 280 of the electrical box 200 are each made as a single piece by molding an insulating plastics material.

The electrical box 200 is installed in a hollow partition in manner similar to the manner described above, and is therefore not described again. It enables the electrical box 200 to be ready to receive the electrical accessory 70, in such a manner that the two elements 70, 200 form a rigid assembly 2 that is fastened properly in the hollow partition.

The present invention is not limited to the embodiments described and shown, and the person skilled in the art can apply any variation thereto in accordance with the spirit of the invention.

In particular, the outside terminals need not be insulation displacement terminals. It would then be necessary, while connecting the electrical box, to strip the insulated electrical conductors beforehand, prior to blocking them in the outside terminals of the metal electrical-connection elements.

In this variant, the securing means for securing the electrical conductors in the outside terminals could thus be formed by spring blades or by screws that could be operated by the installer.

In another variant, provision could be made for the metal electrical-connection elements to be sandwiched, not between the body and the rear plate, but rather between two rear plates fastened to the body.

The invention claimed is:

1. An electrical box comprising:
   a body that presents a side wall that is closed at the rear by a rear wall so as to define an inside volume for receiving at least one electrical accessory;
   at least one metal electrical-connection element that is fastened to said body and that includes an inside terminal for connecting said electrical accessory, and an outside terminal that is situated outside the body for connecting an electrical conductor, said rear wall being arranged so as to provide access, via said inside volume, to the inside terminal of said metal electrical-connection element;
   a cap that is movably mounted on said body, at the rear of said body, to move between an open position in which the cap uncovers said outside terminal, and a closed position in which the cap covers said outside terminal,
   wherein, in the closed position, the cap co-operates with the body to define a passage for electrical conductors, which passage extends, at least in part, at the rear of the electrical box, and
   wherein said passage makes it possible to engage a guide for guiding electrical conductors, the cap or the body including blocking means for blocking said guide.

2. An electrical box according to claim 1, wherein each metal electrical-connection element includes at least one other outside terminal that is situated outside the body for feeding-out at least one other electrical conductor.

3. An electrical box according to claim 2, wherein another cap is provided that is movably mounted on said body, at the rear of said body, to move between an open position in which the another cap uncovers said other outside terminal of each metal electrical-connection element, and a closed position in which the another cap covers said other outside terminal of each metal electrical-connection element.

4. An electrical box according to claim 1, wherein the cap is pivotally mounted on said body.

5. An electrical box according to claim 1, wherein said body includes blocking means for blocking the cap in the closed position.

6. An electrical box according to claim 1, wherein, each outside terminal is an insulation displacement terminal provided with perforator means for perforating an insulating sheath of said electrical conductor, and each cap includes a presser portion that is adapted to press said electrical conductor against said perforator means so as to perforate the insulating sheath of said electrical conductor by moving the cap from the open position to the closed position.

7. An electrical box according to claim 1, wherein three metal electrical-connection elements are provided that are fastened to the rear wall of the body in such a manner as to be insulated from one another electrically.

8. An electrical box according to claim 1, wherein the inside terminal of each metal electrical-connection element presents a contact face that is plane.

9. An electrical box according to claim 1, wherein each metal electrical-connection element is formed as a single piece by cutting and bending a metal sheet.

10. An electrical box according to claim 1, wherein the body is made as a single piece by molding a synthetic insulating material.

11. An electrical box according to claim 1, wherein the body is for flush mounting, and includes an outer peripheral rim that borders the front edge of the side wall, and catch means that project from the side wall.

12. An electrical assembly comprising an electrical box according to claim 1, and an electrical accessory that includes fastener means that are fastened to said body, and connection means that are connected to the inside terminal of each metal electrical-connection element that is fastened to said body.

13. An electrical box, comprising:
an electrical accessory;
a body comprising a side wall closed at a rear part by a rear wall, the body defining an inside volume for receiving the electrical accessory;
a metal electrical-connection element that is fastened to said body and that includes an inside terminal connected to said electrical accessory, and an outside terminal that is situated outside the body for connecting an electrical conductor,
said rear wall providing access, via said inside volume, to the inside terminal of said metal electrical-connection element;
a cap that is movably mounted on said body, the rear wall of said body, the cap movable between i) an open position in which the uncovers said outside terminal, and ii) a closed position in which the cap covers said outside terminal,
wherein, in the closed position, the cap co-operates with the body to define a passage for electrical conductors, which passage extends, at least in part, along an outside surface of the rear wall of the body;
a guide for guiding electrical conductors (63, 64, 65; 93, 94, 95), the guide being engaged with said passage; and
a blocking part that blocks said cap in the closed position with said guide being between the body and the cap.

14. The electrical box according to claim 13, wherein the cap is pivotally mounted on said outside surface of the rear wall of the body.

15. An electrical box comprising:
a body that presents a side wall that is closed at the rear by a rear wall so as to define an inside volume for receiving at least one electrical accessory;
a metal electrical-connection element that is fastened to said body and that includes i) an inside terminal for connecting said electrical accessory, and ii) an outside terminal that is situated outside the body for connecting an electrical conductor,
said rear wall being arranged so as to provide access, via said inside volume, to the inside terminal of said metal electrical-connection element;
a cap that is movably mounted on said body, on the rear wall of said body, the cap movable between i) an open position in which the cap uncovers said outside terminal, and ii) a closed position in which the cap covers said outside terminal,
wherein, in the closed position, the cap co-operates with the body to define a passage for electrical conductors, which passage extends, at least in part, at the rear of the electrical box;
a guide for guiding electrical conductors,
wherein guide engages with said passage; and
blocking means included in one of the group consisting of the cap and the body, the blocking means blocking said guide.

16. The electrical box according to claim 15, wherein the cap is pivotally mounted on said outside surface of the rear wall of the body.

* * * * *